United States Patent
Sweeney et al.

(10) Patent No.: US 10,497,569 B2
(45) Date of Patent: *Dec. 3, 2019

(54) CARBON MATERIALS FOR CARBON IMPLANTATION

(71) Applicant: Entegris, Inc., Billerica, MA (US)

(72) Inventors: Joseph D. Sweeney, Winsted, CT (US); Oleg Byl, Southbury, CT (US); Robert Kaim, Brookline, MA (US)

(73) Assignee: ENTEGRIS, INC., Billerica, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/354,076

(22) Filed: Nov. 17, 2016

(65) Prior Publication Data

US 2017/0069499 A1 Mar. 9, 2017

Related U.S. Application Data

(63) Continuation of application No. 13/682,416, filed on Nov. 20, 2012, now abandoned, which is a continuation of application No. 12/842,006, filed on Jul. 22, 2010, now abandoned.

(60) Provisional application No. 61/227,875, filed on Jul. 23, 2009.

(51) Int. Cl.
*H01L 21/265* (2006.01)
*C23C 14/06* (2006.01)
*C23C 14/48* (2006.01)
*H01L 21/223* (2006.01)
*H01J 37/317* (2006.01)

(52) U.S. Cl.
CPC ............ *H01L 21/265* (2013.01); *C23C 14/06* (2013.01); *C23C 14/0605* (2013.01); *C23C 14/48* (2013.01); *H01J 37/3171* (2013.01); *H01L 21/2236* (2013.01); *H01J 2237/08* (2013.01); *H01J 2237/31701* (2013.01)

(58) Field of Classification Search
CPC ... H01L 21/265; H01L 21/2236; C23C 14/06; C23C 14/0604; C23C 14/48; C23C 14/0605; H01J 37/3171; H01J 2237/31701; H01J 2237/08
See application file for complete search history.

(56) References Cited

U.S. PATENT DOCUMENTS

| | | | |
|---|---|---|---|
| 3,602,778 A | 8/1971 | Ura et al. |
| 3,615,203 A | 10/1971 | Kaneko et al. |
| 3,625,749 A | 12/1971 | Yoshioka et al. |
| 3,658,586 A | 4/1972 | Wang |
| 3,725,749 A | 4/1973 | Groves et al. |
| 4,100,310 A | 7/1978 | Ura et al. |
| 4,128,733 A | 12/1978 | Fraas et al. |
| 4,369,031 A | 1/1983 | Goldman et al. |
| 4,600,801 A | 7/1986 | Guha et al. |
| 4,619,729 A | 10/1986 | Johncock et al. |
| 4,657,774 A | 4/1987 | Satou et al. |
| 4,680,358 A | 7/1987 | Yu |
| 4,722,978 A | 2/1988 | Yu |
| 4,803,292 A | 2/1989 | Ohfune et al. |
| 4,851,255 A | 7/1989 | Lagendijk et al. |
| 4,942,246 A | 7/1990 | Tanaka et al. |
| 5,077,143 A | 12/1991 | Barraclough et al. |
| 5,134,301 A | 7/1992 | Kamata et al. |
| 5,347,460 A | 9/1994 | Gifford et al. |
| 5,436,180 A | 7/1995 | de Fresart et al. |
| 5,441,901 A | 8/1995 | Candelaria |
| 5,497,006 A | 3/1996 | Sferlazzo et al. |
| 5,516,366 A | 5/1996 | Kanno et al. |
| 5,834,371 A | 11/1998 | Ameen et al. |
| 5,943,594 A | 8/1999 | Bailey et al. |
| 5,948,322 A | 9/1999 | Baum et al. |
| 5,977,552 A | 11/1999 | Foad |
| 5,993,766 A | 11/1999 | Tom et al. |
| 6,001,172 A | 12/1999 | Bhandari et al. |
| 6,077,355 A | 6/2000 | Yamashita et al. |
| 6,080,297 A | 6/2000 | Ayers |
| 6,096,467 A | 8/2000 | Shimizu et al. |
| 6,135,128 A | 10/2000 | Graf et al. |
| 6,221,169 B1 | 4/2001 | Bemstein J et al. |
| 6,333,272 B1 | 12/2001 | McMillin et al. |
| 6,346,452 B1 | 2/2002 | Kabir et al. |
| 6,376,664 B1 | 4/2002 | Chan et al. |
| 6,420,304 B1 | 7/2002 | Tsai et al. |
| 6,486,227 B2 | 11/2002 | Nohr et al. |
| 6,518,184 B1 | 2/2003 | Chambers et al. |
| 6,600,092 B2 | 7/2003 | Lee |
| 6,685,803 B2 | 2/2004 | Lazarovich et al. |
| 6,730,568 B2 | 5/2004 | Sohn |
| 6,772,781 B2 | 8/2004 | Doty et al. |
| 6,780,896 B2 | 8/2004 | MacDonald et al. |
| 6,835,414 B2 | 12/2004 | Ramm |

(Continued)

FOREIGN PATENT DOCUMENTS

CN 102339737 A 2/2012
EP 0 079 705 A1 5/1983

(Continued)

OTHER PUBLICATIONS

Translation of search report from TW Patent Application 103145279, dated Nov. 30, 2016, 1 page.

(Continued)

*Primary Examiner* — Laura M Menz
*Assistant Examiner* — Candice Chan
(74) *Attorney, Agent, or Firm* — Entegris, Inc.

(57) ABSTRACT

A method of implanting carbon ions into a target substrate, including: ionizing a carbon containing dopant material to produce a plasma having ions; optionally co-flowing an additional gas or series of gases with the carbon-containing dopant material; and implanting the ions into the target substrate. The carbon-containing dopant material is of the formula $C_wF_xO_yH_z$ wherein if w=1, then x>0 and y and z can take any value, and wherein if w>1 then x or y is >0, and z can take any value. Such method significantly improves the efficiency of an ion implanter tool, in relation to the use of carbon source gases such as carbon monoxide or carbon dioxide.

20 Claims, No Drawings

(56) References Cited

U.S. PATENT DOCUMENTS

| | | | |
|---|---|---|---|
| 6,852,610 B2 | 2/2005 | Noda | |
| 6,872,639 B2 | 3/2005 | DeBoer et al. | |
| 6,893,907 B2 | 5/2005 | Maydan et al. | |
| 6,905,947 B2 | 6/2005 | Goldberg | |
| 7,094,670 B2 | 8/2006 | Collins et al. | |
| 7,135,775 B2 | 11/2006 | Chambers et al. | |
| 7,138,768 B2 | 11/2006 | Maciejowski et al. | |
| 7,144,809 B2 | 12/2006 | Elers et al. | |
| 7,446,326 B2 | 11/2008 | Chaney et al. | |
| 7,553,758 B2 | 6/2009 | Park et al. | |
| 7,572,482 B2 | 8/2009 | Carothers et al. | |
| 7,666,770 B2 | 2/2010 | Sasaki et al. | |
| 7,819,981 B2 | 10/2010 | DiMeo, Jr. et al. | |
| 7,919,402 B2 | 4/2011 | Jacobson et al. | |
| 7,943,204 B2 | 5/2011 | Olander et al. | |
| 7,947,582 B2 | 5/2011 | Hautala et al. | |
| 8,013,312 B2 | 9/2011 | Adams | |
| 8,187,971 B2 | 5/2012 | Russell et al. | |
| 8,237,136 B2 | 8/2012 | Hautala et al. | |
| 8,252,651 B2 | 8/2012 | Kawasaki | |
| 8,603,252 B2 | 12/2013 | Dimeo et al. | |
| 9,960,042 B2 * | 5/2018 | Byl | H01L 21/265 |
| 2002/0011463 A1 | 1/2002 | Van Buskirk et al. | |
| 2002/0014407 A1 | 2/2002 | Allen et al. | |
| 2002/0018897 A1 | 2/2002 | Kuckertz et al. | |
| 2002/0033229 A1 | 3/2002 | Lebouitz et al. | |
| 2002/0145711 A1 | 10/2002 | Magome et al. | |
| 2002/0155724 A1 | 10/2002 | Sakai et al. | |
| 2002/0160588 A1 | 10/2002 | Kim et al. | |
| 2003/0019580 A1 | 1/2003 | Strang | |
| 2003/0023118 A1 | 1/2003 | Kanayama et al. | |
| 2003/0053799 A1 | 3/2003 | Lei | |
| 2004/0002202 A1 | 1/2004 | Horsky et al. | |
| 2004/0018746 A1 | 1/2004 | Arno | |
| 2004/0074285 A1 | 4/2004 | Dimeo, Jr. et al. | |
| 2004/0080050 A1 | 4/2004 | McMillin et al. | |
| 2004/0083962 A1 | 5/2004 | Bang et al. | |
| 2004/0108296 A1 | 6/2004 | Kanayama et al. | |
| 2004/0110351 A1 | 6/2004 | Narasimha | |
| 2004/0166612 A1 | 8/2004 | Maydan et al. | |
| 2004/0200417 A1 | 10/2004 | Hanawa et al. | |
| 2004/0235280 A1 | 11/2004 | Keys et al. | |
| 2005/0191816 A1 | 9/2005 | Vanderpool et al. | |
| 2005/0202657 A1 | 9/2005 | Borland et al. | |
| 2005/0211923 A1 | 9/2005 | Banks | |
| 2006/0086376 A1 | 4/2006 | Dimeo, Jr. et al. | |
| 2006/0097193 A1 | 5/2006 | Horsky et al. | |
| 2006/0115590 A1 | 6/2006 | Suzuki et al. | |
| 2006/0115591 A1 | 6/2006 | Olander et al. | |
| 2006/0174941 A1 | 8/2006 | Cohen et al. | |
| 2006/0264051 A1 | 11/2006 | Thibaut | |
| 2007/0031325 A1 | 2/2007 | Carruthers et al. | |
| 2007/0059848 A1 | 3/2007 | Sasaki et al. | |
| 2007/0148888 A1 | 6/2007 | Krull et al. | |
| 2007/0178678 A1 | 8/2007 | Hatem et al. | |
| 2007/0178679 A1 | 8/2007 | Hatem et al. | |
| 2008/0108208 A1 | 5/2008 | Arevalo et al. | |
| 2008/0248636 A1 | 10/2008 | Olander et al. | |
| 2008/0299749 A1 | 12/2008 | Jacobson et al. | |
| 2008/0305598 A1 | 12/2008 | Horsky et al. | |
| 2009/0087578 A1 | 4/2009 | Hautala et al. | |
| 2010/0112795 A1 | 5/2010 | Kaim et al. | |
| 2010/0224264 A1 | 9/2010 | Homan et al. | |
| 2011/0021011 A1 | 1/2011 | Sweeney et al. | |
| 2011/0079241 A1 | 4/2011 | Sinha et al. | |
| 2011/0143527 A1 | 6/2011 | Platow et al. | |
| 2011/0259366 A1 * | 10/2011 | Sweeney | C23C 14/48 134/10 |
| 2012/0015507 A1 | 1/2012 | Tanaka et al. | |
| 2012/0108044 A1 | 5/2012 | Kaim et al. | |
| 2012/0119113 A1 | 5/2012 | Colvin et al. | |

FOREIGN PATENT DOCUMENTS

| | | |
|---|---|---|
| EP | 0079705 A1 | 5/1983 |
| EP | 0 474 108 A1 | 3/1992 |
| EP | 0474108 A1 | 3/1992 |
| EP | 0 656 668 B1 | 3/1999 |
| EP | 0656668 B1 | 3/1999 |
| JP | 58-8071 A | 1/1983 |
| JP | S58-8071 A | 1/1983 |
| JP | 63-15228 A | 1/1988 |
| JP | S63-15228 A | 1/1988 |
| JP | 64-83147 A | 3/1989 |
| JP | S64-83147 A | 3/1989 |
| JP | 1-225117 A | 9/1989 |
| JP | H01-225117 A | 9/1989 |
| JP | 5-254808 A | 10/1993 |
| JP | H05-254808 A | 10/1993 |
| JP | 6-80681 A | 3/1994 |
| JP | H06-80681 A | 3/1994 |
| JP | 7-90201 A | 4/1995 |
| JP | H07-90201 A | 4/1995 |
| JP | 10-251592 A | 9/1998 |
| JP | H10-251592 A | 9/1998 |
| JP | 2002-343882 A | 11/2002 |
| KR | 10-2008-0033561 A | 4/2008 |
| KR | 10-2010-0029539 A | 3/2010 |
| TW | 521295 A | 2/2003 |
| TW | 521295 B | 2/2003 |
| TW | 200746272 A | 12/2007 |
| TW | M352859 U1 | 3/2009 |
| WO | 98/11764 A1 | 3/1998 |
| WO | 9811764 A1 | 3/1998 |
| WO | 01/43157 A1 | 6/2001 |
| WO | 0143157 A1 | 6/2001 |
| WO | 03/057667 A2 | 7/2003 |
| WO | 03057667 A2 | 7/2003 |
| WO | 03/100806 A1 | 12/2003 |
| WO | 03100806 A1 | 12/2003 |
| WO | 2004/003973 A2 | 1/2004 |
| WO | 2004003973 A2 | 1/2004 |
| WO | 2004/053945 A2 | 6/2004 |
| WO | 2004053945 A2 | 6/2004 |
| WO | 2005/027208 A1 | 3/2005 |
| WO | 2005027208 A1 | 3/2005 |
| WO | 2005/037421 A2 | 4/2005 |
| WO | 2005037421 A2 | 4/2005 |
| WO | 2005/059942 A2 | 6/2005 |
| WO | 2005059942 A2 | 6/2005 |
| WO | 2005/060602 A2 | 7/2005 |
| WO | 2005060602 A2 | 7/2005 |
| WO | 2005/114692 A2 | 12/2005 |
| WO | 2005114692 A2 | 12/2005 |
| WO | 2006/047373 A2 | 5/2006 |
| WO | 2006047373 A2 | 5/2006 |
| WO | 2006/095086 A2 | 9/2006 |
| WO | 2006095086 A2 | 9/2006 |
| WO | 2007/027798 A2 | 3/2007 |
| WO | 2007027798 A2 | 3/2007 |
| WO | 2007/120814 A2 | 10/2007 |
| WO | 2007120814 A2 | 10/2007 |
| WO | 2007/134183 A2 | 11/2007 |
| WO | 2007/136887 A2 | 11/2007 |
| WO | 2007134183 A2 | 11/2007 |
| WO | 2007136887 A2 | 11/2007 |
| WO | WO 2007127865 * | 11/2007 |
| WO | 2007/146942 A2 | 12/2007 |
| WO | 2007146942 A2 | 12/2007 |
| WO | 2008/121620 A1 | 10/2008 |
| WO | 2008121620 A1 | 10/2008 |

OTHER PUBLICATIONS

Jacques Pelletier & Andre Anders, Plasma-Based Ion Implantation and Deposition: A Reivew of Physics, Technology, and Applications, IEEE Transactions on Plasma Science, vol. 33, No. 6, Dec. 20005, pp. 1944-1959.

Apr. 16, 2013 Non-Final Office Action Issued in U.S. Appl. No. 12/842,006 by Candice Chan.

(56) References Cited

OTHER PUBLICATIONS

Jacobson, D., et al., "Ultra-high resolution mass spectroscopy of boron cluster ions", "Nuclear Instruments and Methods in Physics Research Section B: Beam Interactions with Materials and Atoms", Aug. 1, 2005, pp. 406-410 (Abstract and Figures), vol. 237, No. 1-2.

Pelletier, J., et al., "Plasma-Based Ion Implantation and Deposition: A Review of Physics, Technology, and Applications", "IEEE Transactions on Plasma Science", Dec. 2005, pp. 1944-1959, vol. 33, No. 6.

Weast, R. (Ed.), "Physical Constants of Inorganic Compounds—Boric Acid", "Handbook of Chemistry and Physics, 56th Edition", Sep. 1975, pp. B-78, Publisher: CRC Press, Inc.

Note: Applicant hereby offers to furnish examiner upon request with copies of Office Actions cited herein.

Jacobson, D., et al, "Ultra-high resolution mass spectroscopy of boron cluster ions", "Nuclear Instruments and Methods in Physics Research Section B: Beam Interactions with Materials and Atoms", vol. 237, No. 1-2, pp. 406-410 (Abstract and Figures) (Aug. 1, 2005).

Weast, R. (Ed.), "Physical Constants of Inorganic Compounds—Boric Acid", "Handbook of Chemistry and Physics, 56th Edition", p. B-78, Publisher: CRC Press, Inc. (Sep. 1975).

\* cited by examiner

CARBON MATERIALS FOR CARBON IMPLANTATION

CROSS-REFERENCE TO RELATED APPLICATIONS

This is a continuation of U.S. patent application Ser. No. 13/682,416 filed Nov. 20, 2012, which is a continuation under 35 USC 120 of U.S. patent application Ser. No. 12/842,006 filed Jul. 22, 2010 in the names of Joseph D. Sweeney, Oleg Byl and Robert Kaim for "Carbon Materials for Carbon Implantation," which in turn claims the benefit of priority under 35 USC 119 of U.S. Provisional Patent Application No. 61/227,875 filed Jul. 23, 2009 in the names of Joseph D. Sweeney, Oleg Byland and Robert Kaim for "Carbon Materials for Carbon Implantation." The disclosures of U.S. patent application Ser. Nos. 13/682,416 and 12/842,006 and U.S. Provisional Patent Application No. 61/227,875 are hereby incorporated herein by reference, in their respective entireties.

TECHNICAL FIELD

The present disclosure relates to ion implantation methods and systems, and more particularly, to carbon materials for carbon ion implantation in such systems.

BACKGROUND

Ion implantation is used in integrated circuit fabrication to accurately introduce controlled amounts of dopant impurities into semiconductor wafers and is one of the processes of microelectronic/semiconductor manufacturing. In such implantation systems, an ion source ionizes a desired dopant element gas, and the ions are extracted from the source in the form of an ion beam of desired energy. Extraction is achieved by applying a high voltage across suitably-shaped extraction electrodes, which incorporate apertures for passage of the extracted beam. The ion beam is then directed at the surface of a workpiece, such as a semiconductor wafer, in order to implant the workpiece with the dopant element. The ions of the beam penetrate the surface of the workpiece to form a region of desired conductivity.

Several types of ion sources are used in ion implantation systems, including the Freeman and Bernas types that employ thermoelectrodes and are powered by an electric arc, microwave types using a magnetron, indirectly heated cathode (IHC) sources, and RF plasma sources, all of which typically operate in a vacuum. In any system, the ion source generates ions by introducing electrons into a vacuum arc chamber (hereinafter "chamber") filled with the dopant gas (commonly referred to as the "feedstock gas"). Collisions of the electrons with atoms and molecules in the dopant gas result in the creation of ionized plasma consisting of positive and negative dopant ions. An extraction electrode with a negative or positive bias will respectively allow the positive or negative ions to pass through an aperture as a collimated ion beam, which is accelerated towards the target material.

In many ion implantation systems, carbon, which is known to inhibit diffusion, is implanted into the target material to produce a desired effect in the integrated circuit device. The carbon is generally implanted from a feedstock gas such as carbon monoxide or carbon dioxide. The use of carbon monoxide or carbon dioxide gases can result in oxidation of the metal surfaces within the plasma source (arc chamber) of the ion implanter tool, and can also result in carbon residues depositing on electrical insulators. These phenomena reduce the performance of the implanter tool, thereby resulting in the need to perform frequent maintenance. Oxidation can result in inefficiencies in the implantation process.

Frequency and duration of preventive maintenance (PM) is one performance factor of an ion implantation tool. As a general tendency the tool PM frequency and duration should be decreased. The parts of the ion implanter tool that require the most maintenance include the ion source, which is generally serviced after approximately 50 to 300 hours of operation, depending on operating conditions; the extraction electrodes and high voltage insulators, which are usually cleaned after a few hundred hours of operation; and the pumps and vacuum lines of vacuum systems associated with the tool. Additionally, the filament of the ion source is often replaced on a regular basis.

Ideally, feedstock molecules dosed into an arc chamber would be ionized and fragmented without substantial interaction with the arc chamber itself or any other components of the ion implanter. In reality, feedstock gas ionization and fragmentation can results in such undesirable effects as arc chamber components etching or sputtering, deposition on arc chamber surfaces, redistribution of arc chamber wall material, etc. In particular, the use of carbon monoxide or carbon dioxide gases can result in carbon deposition within the chamber. This can be a contributor to ion beam instability, and may eventually cause premature failure of the ion source. The residue also forms on the high voltage components of the ion implanter tool, such as the source insulator or the surfaces of the extraction electrodes, causing energetic high voltage sparking. Such sparks are another contributor to beam instability, and the energy released by these sparks can damage sensitive electronic components, leading to increased equipment failures and poor mean time between failures (MTBF).

In another instance of undesirable deposition, various materials (such as tungsten) can accumulate on components during extended ion implantation processes. Once enough tungsten is accumulated, the power used to maintain temperature sufficient to meet the beam current setpoint may not be sustainable. This causes loss of ion beam current, which leads to conditions that warrant the replacement of the ion source. The resultant performance degradation and short lifespan of the ion source reduces productivity of the ion implanter tool.

Yet another cause of ion source failure is the erosion (or sputtering) of material. For example, metallic materials such as tungsten (e.g., the cathode of an IHC source or the filament of a Bernas source) are sputtered by ions in the plasma of the arc chamber. Because sputtering is dominated by the heaviest ions in the plasma, the sputtering effect may worsen as ion mass increases. In fact, continued sputtering of material "thins" the cathode eventually leading to formation of a hole in the cathode ("cathode punch-through" in the case of IHC), or for the case of the Bernas source, creates an opening in the filament. Performance and lifetime of the ion source are greatly reduced as a result. The art thus continues to seek methods that can maintain a balance between the accumulation and erosion of material on the cathode to prolong the ion source life.

SUMMARY

In one aspect, the present disclosure relates to a method of implanting carbon ions into a target substrate. This method comprises: ionizing a carbon-containing dopant material to produce a plasma having ions; and implanting the ions into the target substrate. The carbon-containing dopant material is of the formula $C_wF_xO_yH_z$ wherein if w=1, then x>0 and y and z can take any value, and wherein if w>1 then x or y is >0, and z can take any value.

In another aspect, the present disclosure relates to another method of implanting carbon ions into a target substrate. This method comprises: ionizing a carbon-containing dopant material to produce a plasma having ions; co-flowing an additional gas or series of gases with the carbon-containing dopant material; and implanting the ions into the target substrate. The carbon-containing dopant material is of the formula $C_wF_xO_yH_z$, wherein w, x, y and z are as defined above.

In another aspect, the present disclosure relates to a method of improving the efficiency of an ion implanter tool. This method comprises: selecting a carbon-containing dopant material of the formula $C_wF_xO_yH_z$ for use in the ion implanter tool in a chamber, wherein w, x, y and z are as defined above; ionizing the carbon-containing dopant material; and implanting a carbon ion from the ionized carbon-containing dopant material using the ion implanter tool. The selecting of the material of the formula $C_wF_xO_yH_z$ minimizes the amount of carbon and/or non-carbon elements deposited in the chamber after the implanting of the carbon ion. In doing so, the performance of the ion source is optimized.

Other aspects, features and embodiments of the present disclosure will be more fully apparent from the ensuing description and appended claims.

DETAILED DESCRIPTION

In accordance with the present disclosure, carbon ions are implanted from a feedstock source material into the target material of a substrate via an ion implantation process. In one exemplary embodiment, an ion source generates the carbon ions by introducing electrons into a vacuum arc chamber filled with a carbon-containing dopant gas as the feedstock material. The chamber has tungsten walls on which a filament electrode and a repeller electrode are mounted and separated from the walls by ceramic insulators. Collisions of the electrons with molecules in the carbon-containing dopant gas result in the creation of ionized plasma consisting of positive carbon ions. The ions are then collimated into an ion beam, which is accelerated towards the target material. The beam may be directed through a mask having a plurality of openings therein to implant the carbon ions in the desired configuration. The present disclosure is not limited in this regard as other means of implanting carbon ions are within the scope of the present disclosure. Furthermore, the present disclosure is not limited to the implantation of carbon ions, as any ion other than carbon (or in addition to carbon) can be selected for implantation.

In any embodiment, to generate the carbon ions, the carbon-containing dopant material has the formula $C_wF_xO_yH_z$ wherein if w=1, then x>0 and y and z can take any value, and wherein if w>1 then x or y is >0, and z can take any value. The carbon atom is separated from the remainder of the molecule, thereby resulting in an ionized plasma that includes positive carbon ions. The positive carbon ions may be singular, or they may form clusters of two or more carbon atoms. Alternatively, molecular ions of the form $C_aF_bO_cH_d^+$, wherein a>0, and b, c, and d can have any value, may be formed in order to co-implant multiple atomic species simultaneously. For example, implanting an ion such as $CF^+$ may eliminate a later $F^+$ implant. For cases in which co-implantation of species compromises the integrated circuit quality or performance, the carbon dopant material can be used to produce non-carbon ions for implantation. An example would be the implantation of $F^+$. The benefit is that a second dopant material containing fluorine may not be required.

The ratios of C, F, O, and H (as denoted by w, x, y, and z) are chosen to optimize ion source life and beam current. While the use of carbon achieves specific integrated circuit device characteristics, the carbon will deposit within the ion source chamber of the ion implanter, causing electrical shorts or particle generation. Additionally, the carbon can cause sputtering of the cathode (IHC source) or filament (Bernas source), resulting in shortened ion source life. The presence of oxygen within the dopant material helps to minimize the deposition of carbon by oxidizing carbon deposits to form CO or CO2. However, the oxygen can also oxidize components of the ion source, such as the cathode or the filament. The oxidation of these components may degrade the performance of the ion implant tool, thereby leading to frequent maintenance requirements. By adding fluorine to the dopant source, the oxidation of the cathode or filament can be minimized. However, fluorine can also react with the metallic walls of the arc chamber (usually tungsten or molybdenum), forming gases of the formula $WF_x$ or $MoF_x$ wherein x=1-6. When these gases contact the cathode or filament, they tend to react and deposit tungsten. While this is beneficial in that it can help balance any sputtering due to the ions within the plasma, it may be desirable to add some hydrogen to the molecule to balance the tungsten deposition rate (hydrogen will restrict the ability of the fluorine from reacting with the metallic walls to form the metal fluorides that subsequently cause metal deposition on the cathode or filament).

In one embodiment, the $C_wF_xO_yH_z$ source gas comprises $COF_2$. When $COF_2$ is used as the source gas, the molecule is ionized in the arc chamber, and $C^+$ ions are separated via mass analysis and then implanted into the target material. Within the arc chamber, O and F ions and neutrals are also present. The oxygen helps to minimize carbon deposits, while the fluorine serves to keep the cathode or filament from forming an oxide surface layer. In this manner, the performance of the ion source is greatly improved.

The present disclosure also contemplates the simultaneous flowing of $C_wF_xO_yH_z$ material(s) with oxygen or an oxygen-containing gas such as air to modify or control the ratios of C, F, O, and H, thereby further modifying or controlling the amount of carbon ions implanted and optimizing the trade-off between carbon ions implanted and oxide formation. In particular, the $C_wF_xO_yH_z$ can be co-flowed with $COF_2$, $CO_2$, CO, or any other oxygen-containing gas. Without being bound by theory, it is contemplated that the co-flowing of $COF_2$ or similar gases balances the deposition of the carbon ion with the coating of the arc chamber and etching.

The present disclosure additionally contemplates the simultaneous flowing of $C_wF_xO_yH_z$ material(s) with gases such as fluorine and hydrogen or dilution with inert gases such as nitrogen, argon, xenon, helium, combinations of the foregoing, and the like. The use of inert gases helps to sustain a plasma when flowing dopant gases.

By adjusting the ratios of elements in and generating carbon ions from a carbon-containing dopant gas having the formula $C_wF_xO_yH_z$ (and optionally co-flowing the dopant gas with $COF_2$, $CO_2$, CO, (or another carbon-containing molecule) fluorine, hydrogen, nitrogen, argon, or the like), the amount of carbon implanted is maximized and the amounts of non-carbon elements are minimized with regard to the deposition thereof within the chamber. In such manner, the efficiency of the implanter tool can be improved. Additionally, the downtime of such a tool (for maintenance, cleaning, and the like) can also be reduced.

Furthermore, the $C_wF_xO_yH_z$ material could be flowed simultaneously with up to four additional gases. Such gases include, but are not limited to, (1) $CO+F_2+H_2+O_2$; (2) $CO+COF_2+H_2$; and (3) $CF_4+CH_4+O_2$. The present disclosure is not limited in this regard as other gases are within the scope of the present invention.

Although this disclosure has included various detailed embodiments, it will be understood by those of skill in the art that various changes may be made and equivalents may be substituted for elements thereof without departing from the scope of the disclosure. In addition, modifications may be made to adapt a particular situation or material to the teachings of the invention without departing from the essential scope thereof. Therefore, it is intended that the disclosure not be limited to the particular embodiments disclosed in the above detailed description, but that the disclosure will include all embodiments falling within the spirit and scope of the foregoing description.

What is claimed is:

1. A method of implanting carbon in a substrate from a carbon-containing dopant material, comprising:
    flowing a carbon-containing dopant material comprising a carbon-containing gas; into an ion implantation chamber;
    ionizing the carbon-containing dopant material to form ions comprising positive carbon ions;
    implanting the carbon ions in the substrate; and
    flowing a fluorine-containing gas into the ion implantation chamber, while the carbon ions are being implanted, thereby increasing an amount of the carbon ions implanted in the substrate and reducing an amount of carbon or non-carbon elements deposited on the ion implantation chamber.

2. The method of claim 1, wherein an additional gas or gases, selected from the group consisting of oxygen, an oxygen-containing gas that is different than $CO_2$ and CO, air, hydrogen, nitrogen, argon, xenon, and helium, flows with the carbon-containing and fluorine-containing gases.

3. The method of claim 2, wherein the additional gas or gases comprises hydrogen or helium.

4. The method of claim 2, wherein the additional gas or gases comprises inert gas selected from the group consisting of nitrogen, argon, xenon, helium, and combinations thereof.

5. The method of claim 2, wherein the additional gas or gases comprises an oxygen-containing gas.

6. The method of claim 1, wherein the fluorine-containing gas comprises $COF_2$.

7. The method of claim 1, wherein the carbon-containing gas comprises CO.

8. The method of claim 1, wherein the carbon-containing gas comprises $CO_2$.

9. The method of claim 1, wherein the fluorine-containing gas comprises fluorine and carbon, oxygen, or both carbon and oxygen.

10. The method of claim 1, comprising implantation of multiple implantation species.

11. The method of claim 1, wherein the ionizing is conducted in an arc chamber of the ion implantation chamber, to which the carbon-containing and fluorine-containing gases are flowed.

12. The method of claim 1, comprising separating $C^+$ ions via mass analysis.

13. The method of claim 1, wherein the carbon-containing and fluorine-containing gases, and an optional additional gas, comprise a gas combination selected from the group consisting of:
    (i) $CO+F_2$;
    (ii) $CO+F_2+O_2$;
    (iii) $CO+F_2+H_2$;
    (iv) $CO+F_2+H_2+O_2$;
    (v) $CO+COF_2$;
    (vi) $CO+COF_2+H_2$;
    (vii) $CO+CF_4$;
    (viii) $CO+CH_3F$;
    (ix) $CO+H_2+CF_4$;
    (x) $CO+H_2+CH_3F$;
    (xi) $CF_4+CH_4$;
    (xii) $CF_4+CH_4+O_2$;
    (xiii) $CO_2+F_2$;
    (xiv) $CO_2+F_2+O_2$;
    (xv) $CO_2+F_2+H_2$;
    (xvi) $CO_2+F_2+H_2+O_2$;
    (xvii) $CO_2+COF_2$;
    (xviii) $CO_2+COF_2+H_2$;
    (xix) $CO_2+CF_4$;
    (xx) $CO_2+CH_3F$;
    (xxi) $CO_2+H_2+CF_4$; and
    (xxii) $CO_2+H_2+CH_3F$.

14. The method of claim 1 wherein the carbon-containing gas and fluorine-containing gas comprises CO, $CO_2$, or both CO and $CO_2$, and $COF_2$.

15. The method of claim 14 wherein ionizing generates carbon ions, oxygen ions, and fluorine ions from the CO, $CO_2$, or both CO and $CO_2$, and $COF_2$.

16. The method of claim 15 wherein CO, $CO_2$, or both CO and $CO_2$, and $COF_2$, are present in a molar ratio which maximizes that amount of carbon implanted and minimizes the amounts of carbon or non-carbon elements deposited on the chamber.

17. The method of claim 1 which minimizes carbon, non-carbon elements, or both, deposited on the ion implantation chamber.

18. The method of claim 1 wherein ionizing generates fluorine ions and fluorine ions minimize oxidation of a cathode or filament in the ion implantation chamber.

19. The method of claim 1 wherein, the fluorine-containing gas is introduced into the ion implantation chamber as a co-flow with the carbon-containing gas.

20. The method of claim 1 wherein, the fluorine-containing gas is simultaneously flowed with the carbon-containing gas.

* * * * *